(12) United States Patent
Swift (10) Patent No.: US 6,392,402 B1
(45) Date of Patent: May 21, 2002

(54) HIGH CREST FACTOR RMS MEASUREMENT METHOD

(75) Inventor: Steven Dennis Swift, Seattle, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 09/126,987

(22) Filed: Jul. 30, 1998

(51) Int. Cl.$^7$ .................... G01R 15/00; G01R 7/00
(52) U.S. Cl. .................. 324/132; 324/115; 324/142
(58) Field of Search .................... 324/132, 115, 324/121 R, 182, 103 R, 99 D, 142; 702/124, 91, 64, 190, 189

(56) References Cited

U.S. PATENT DOCUMENTS

| | | |
|---|---|---|
| 3,657,528 A | 4/1972 | Plante |
| 3,807,816 A | 4/1974 | Hamburg |
| 4,034,291 A * | 7/1977 | Allen et al. ............ 324/121 R |
| 4,337,517 A * | 6/1982 | Nicket et al. ............ 324/130 |
| 4,375,038 A | 2/1983 | Crosby |
| 4,389,708 A | 6/1983 | Baldock |
| 4,575,649 A | 3/1986 | Gardiner et al. |
| 4,933,631 A | 6/1990 | Eccleston |
| 5,117,180 A | 5/1992 | Swerlein |
| 5,148,110 A * | 9/1992 | Helms ............ 324/323 |
| 5,220,276 A | 6/1993 | Kleefstra |
| 5,508,607 A * | 4/1996 | Gibson ............ 324/121 R |
| 5,570,028 A * | 10/1996 | Sperlazzo et al. ......... 324/530 |
| 5,698,984 A * | 12/1997 | Little et al. ............ 324/601 |
| 5,930,745 A * | 7/1999 | Swift ............ 701/190 |

FOREIGN PATENT DOCUMENTS

EP 99305986 * 11/1999

OTHER PUBLICATIONS

Burr–Brown Research Corporation, *Operational Amplifiers Design and Applications*, 1971, pp. 251–257.
Sousa, J. L., "Voltage limiter restrains fast op amps", EDN Electrical Design News, U.S, Cahners Publishing Co., Newton, MA, Mar. 31, 1988, vol. 33, No. 7, pp. 198,200, XP000054261.
Pessen, D. et al, "Accurate Analog Limiting Circuits", Instruments and Control Systems, US, Cilton Company, Radnor, Jan. 1971, vol. 44, No. 1, p. 13, XP002073171.

* cited by examiner

*Primary Examiner*—Safet Metjahic
*Assistant Examiner*—Jermele M. Hollington
(74) *Attorney, Agent, or Firm*—Dellett and Walters (57) ABSTRACT

An rms converter accommodates incoming signals of large crest factor by using an amplifier having a transfer function of non-uniform slope. The amplifier has a lower gain for larger signals. The output of the amplifier is converted to digital voltage values. The non-uniform gain of the amplifier is compensated for in digital calculations of the rms value. The invention produces accurate rms measurements by accurately measuring lower incoming signal voltages while still accommodating high peak voltages. The invention also reduces the dynamic range requirements for the analog to digital converter.

20 Claims, 8 Drawing Sheets

HIGH CREST FACTOR RMS MEASUREMENT METHOD

BACKGROUND OF THE INVENTION

This invention relates to measurements of electrical voltages and in particular to measurement of rms values of time-varying voltages.

When measuring the voltage of an electric signal, it is useful to represent the voltage value by a single number, even though the voltage may be varying rapidly in time. One common measurement is the "peak" voltage, which represents the maximum magnitude present in the signal. In a sinusoidal signal, for example, the peak voltage is one half the voltage difference between a minimum and a maximum of the sine curve.

It is often more useful to represent a time-varying voltage by some type of average value that would correspond to an equivalent direct current (DC) voltage, because the equivalent DC current determines the energy loss or heating caused by applying a voltage across a resistor. A simple arithmetic average of the voltage over time is typically not useful because time varying signals, such as an alternating current (AC) signal in which the voltage varies sinusoidally between positive and negative values, often have an average voltage over time of approximately zero. A more useful value to represent the time varying voltage is the root mean square ("rms") value, which is the square root of the integral of the square of the voltage over time. The ratio of the peak voltage to the rms voltage of a signal is known as the "crest factor."

Systems for determining an rms voltage from a time-varying incoming signal are known as rms converters, a common type of which is the log-antilog rms converter described in U.S. Pat. No. 4,389,708, which is assigned to the assignee of the present invention.

Electrical measurement instruments are typically accurate over a limited range, in part because circuit components in the instruments are linear over only a limited range. Thus, measuring devices have difficulty measuring signals that have a high crest factor, that is, signals that include peak voltage values that are significantly larger than the rms value. Inaccurate measurement of the high peak voltages adversely affects the accuracy of the calculated rms value.

The ratio of the highest peak that can be accurately measured to the maximum rms value is called the crest factor limitation of the measuring device. Known methods for increasing the crest factor limitation by shrinking the incoming signal to fit the device capability do so by sacrificing measurement accuracy at lower voltages. The signal being measured, however, typically has a low voltage over most of the measurement interval and low voltages, therefore, contribute the most to the rms calculation.

Analog gain correction methods are known for extending the crest factor limitation, but such methods require switching the gain at the front end of the analog rms converter. This gain switching creates problems with settling time, overshooting, and accuracy at the lower voltages. Extending both range and accuracy of a measuring device requires more complex and costly components and circuits.

Another method is to use two rms converters, one to process high incoming voltages and one to process receive low voltages. The outputs of the two rms converters are then combined in an analog adder with appropriate scaling. The use of two rms converters increases expense and size of the resultant device.

The crest factor limitation problem is particularly acute in rms converters that convert the incoming signal to digital values before determining the rms value. The additional capacity required for digitally processing a high peak and converting it from an analog signal into a digital value is costly, and is seldom used, because the majority of the signal is well below the maximum anticipated peak.

SUMMARY OF THE INVENTION

In accordance with the invention, a high crest factor, time-varying signal can be easily and accurately converted to an rms value.

Accordingly, it is an object of the present invention to provide an improved method and apparatus for determining an rms value of an incoming signal.

It is a further object of the present invention to provide such an improved method and apparatus that can accurately measure incoming signals having high crest factors.

It is yet another object of the present invention to provide such a method and apparatus that can utilize components having limited dynamic range.

The present invention is a method and apparatus for processing an incoming signal at the front end of an rms converter and a method and apparatus for determining an rms value of a time-varying electrical signal. In accordance with the present invention, an incoming, time-varying signal is processed by an amplifier having a transfer function of non-uniform slope. Higher voltage portions of the incoming signal are amplified less than lower voltage portions, thereby reducing the maximum voltage of the signal output from the amplifier.

When the output signal is processed to determine an rms value, the processing includes compensating for the known non-uniform slope of the transfer function. By using a transfer function of non-uniform slope and compensating for the non-uniformity in the processing step, the crest factor of the measuring device is increased without the necessity of increasing the dynamic range of the components following the amplifier.

In a preferred embodiment, the transfer function comprises a line having a change in slope at a voltage of a predetermined magnitude. The slope of the line decreases above the predetermined magnitude, thereby reducing the amplifier output voltage value for large signals. The amplifier output is fed into an analog to digital converter and is then digitally processed to produce an rms value. The digital processing includes weighting the signals in accordance with the appropriate gain factor, so that each part of the time-varying signal contributes appropriately to the rms calculation.

The invention thus accommodates the infrequent peaks of high crest factor signals while still maintaining accuracy at the lower voltages levels of the preponderance of the incoming signal. The simplicity and low cost solution to high crest factor rms measurement provided by the present invention makes it particularly suitable for application in hand-held or small bench top multimeters.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

A preferred embodiment of the present invention comprises a system for determining an rms voltage value of a time varying electrical signal.

Figure 1:
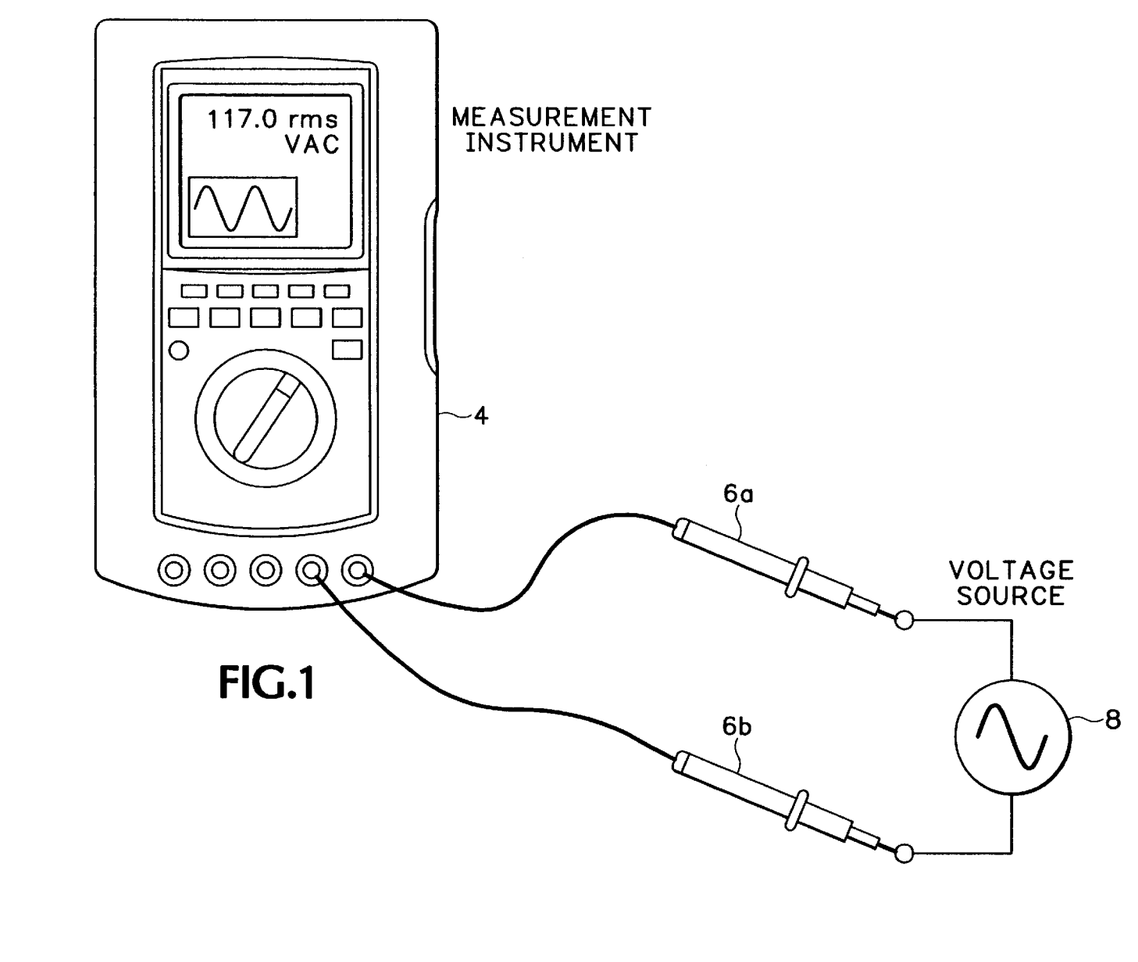
FIG. 1 shows a measuring instrument that incorporates the present invention.

FIG. 1 is a drawing (not to scale) of a measurement instrument 4 coupled via test leads 6a and 6b to a voltage source 8 to obtain an input signal. The measurement instrument 4 is designed to be used in service, installation, and maintenance environments in which a variety of input signals having a variety of waveshapes may be encountered. Skilled persons will recognize that the input signal source need not be a voltage source, but could be any signal source, for example, a current source, provided that the input signal is appropriately conditioned. The measurement instrument 4 may be implemented in the form of a digital multimeter, an oscilloscope, or other measurement instrument for measuring input signal voltages.

Figure 2:
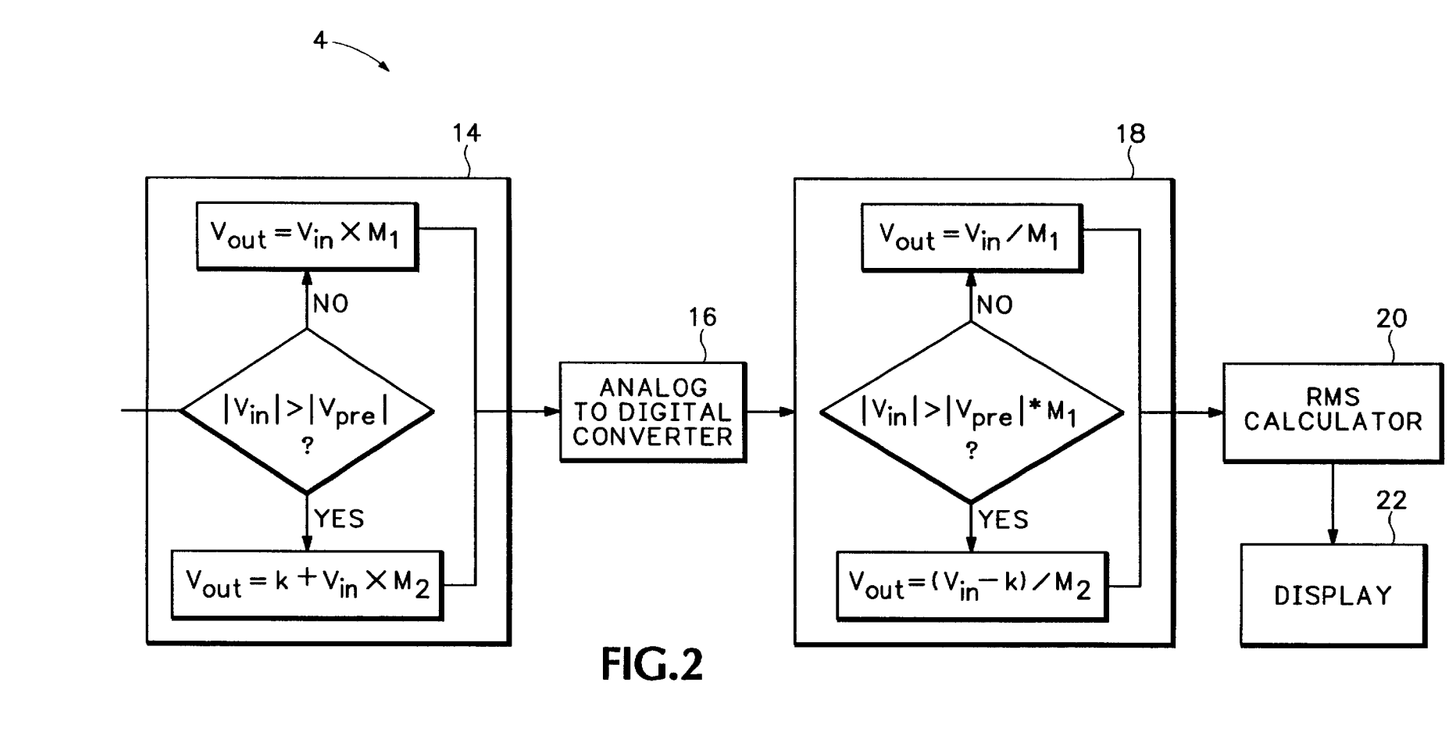
FIG. 2 is a block diagram of a circuit used in the present invention.

FIG. 2 shows a block diagram of a portion of a measurement device 4 that includes an amplifier circuit 14, an analog to digital converter 16, a compensator circuit 18, an rms converter calculator 20, and a display 22.

Figure 3:
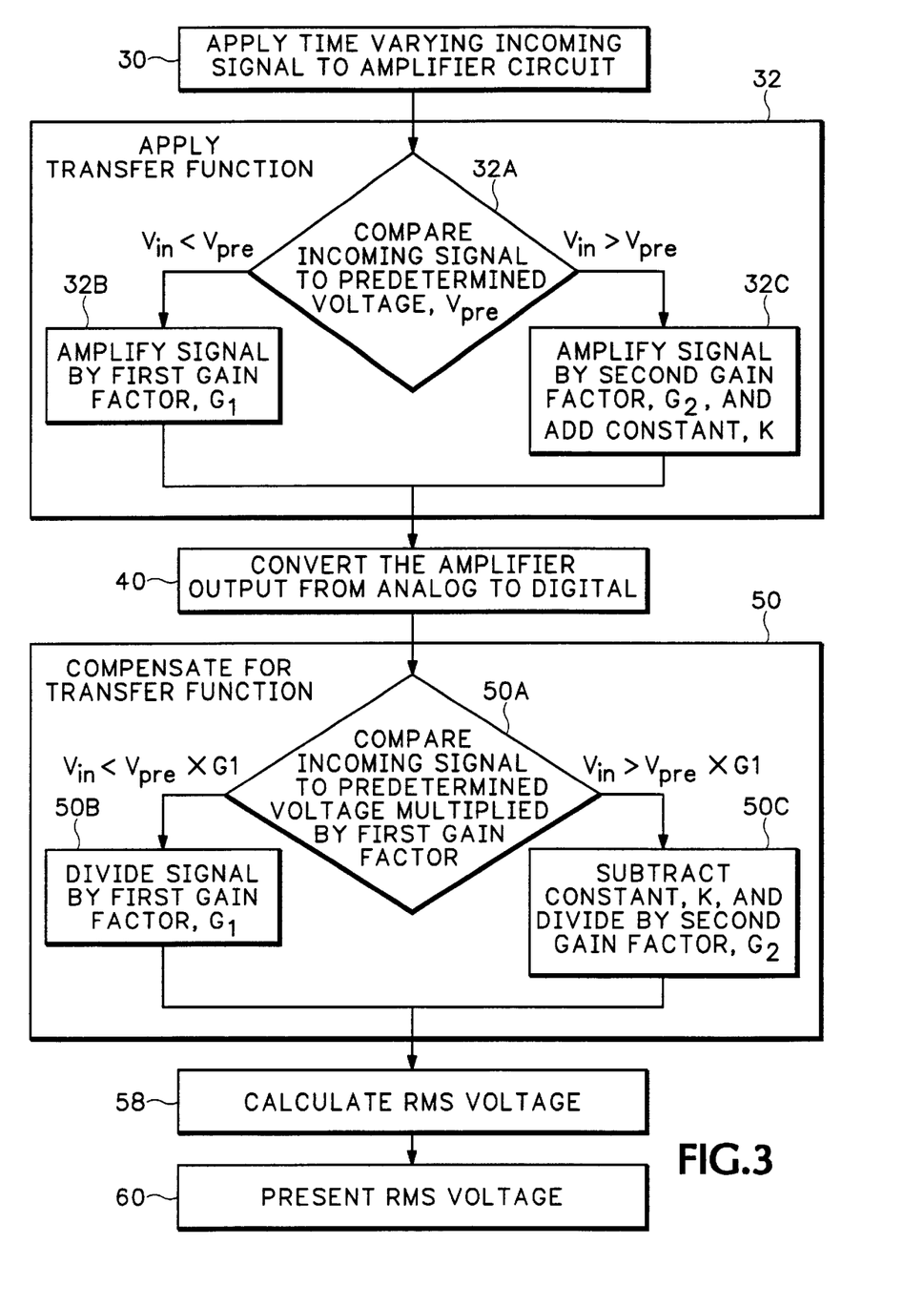
FIG. 3 is a flowchart showing the steps of a preferred embodiment of the present invention.

FIG. 3 is a flowchart showing the steps of a preferred embodiment of the method of the present invention. Step 30 shows that a time varying electrical signal is applied to an input of amplifier circuit 14. Step 32 shows that the time varying electrical signal is amplified in accordance with the transfer function of amplifier 14. Steps 32A, 32B, and 32C show in more detail how the time varying electrical signal is amplified in accordance with a preferred transfer function.

Step 32A shows that the voltage value of the time varying signal is compared to a predetermined value, $V_{pre}$. Step 32B shows that if the magnitude of the signal voltage is less than $V_{pre}$, the signal is amplified by a first gain factor, $G_1$. Step 32C shows that if the magnitude of the signal voltage is greater than $V_{pre}$, the signal is amplified by a second gain factor, $G_2$, and the magnitude increased by a constant, K.

Figure 4:
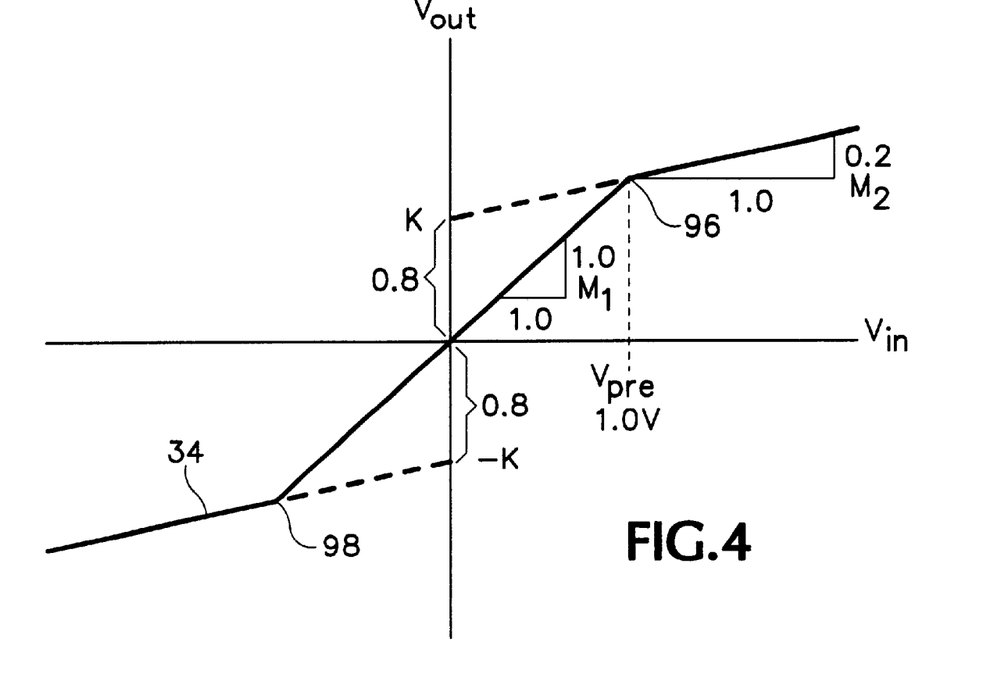
FIG. 4 is an example of a transfer function of a preferred amplifier used in an embodiment of the present invention.

FIG. 4 shows a transfer function 34 of a preferred amplifier 14. For input voltages having an amplitude less than the predetermined voltage $V_{pre}$, the transfer function has a slope $m_1$ equal to the amplifier gain factor, $G_1$. For positive input voltages having a magnitude greater than the predetermined voltage $V_{pre}$, the transfer function is an affine function having a slope $m_2$ equal to the second amplifier gain, $G_2$, and y-axis intercept equal to a constant, K, which is calculated by multiplying $V_{pre}$ by the difference in the slopes ($m_2-m_1$). The constant chosen in this way ensures that the transfer function is continuous and has an inverse function, that is, each output value from the amplifier corresponds to one and only one input value. The transfer function is symmetrical for positive and negative voltages, so the y-intercept of the portion of the transfer function for negative incoming voltages less that $-V_{pre}$ is $-k$.

In one embodiment, the predetermined voltage $V_{pre}$ is 1.0 V, the first amplifier gain is 1.0, the second amplified gain is 0.2, and the constant can be calculated to be 0.8 V. In this example, for an input voltage of 0.5 V, which is of lesser magnitude than the predetermined voltage of 1.0 V, the amplifier output voltage is equal to 0.5 V multiplied by 1.0, the first amplifier gain, for a resultant output of 0.5 V. If the input voltage is 3.0 V, which is greater in magnitude than the predetermined voltage, the output voltage is 3.0 V multiplied by the second amplifier gain, 0.2, plus the constant, 0.8 V, to produce an amplifier output voltage of 1.4 V. If the input voltage is exactly the predetermined voltage, 1.0 V, the output can be determined to be 1.0 V, using either of the two calculations.

Step 40 shows that the output of the amplifier circuit 14 is converted into a digital signal by analog-to-digital converter (ADC) 16. ADC 16 samples the output from amplifier circuit 14 and converts it to digital values representing the voltage value of the amplifier output during small sampling time intervals.

Step 50 shows that compensator 18 uses an inverse of the amplifier's transfer function to digitally convert the amplifier output values back into the values that accurately represent the actual values of the time varying signal being measured. Steps 50A, 50B, and 50C show in more detail how step 50 is accomplished. Step 50A shows that a determination is made as to whether the incoming signal was greater than $V_{pre}$. If the incoming signal was less than $V_{pre}$, step 50B shows that the digital value is divided by the first amplifier gain. If the incoming signal was greater than $V_{pre}$, step 50C shows that the constant is subtracted from the digital value and the result is divided by the second amplifier gain.

In the example above, incoming voltage values that were less than the $V_{pre}$ were unchanged by the transfer function (which had a slope of 1.0), so the compensator merely divides by 1.0 and makes no changes to those digital values. For time-varying signal values that were greater than $V_{pre}$, the values were changed by amplifier circuit 14, and compensator 18 digitally converts the changed values back to the original values of the time-varying signal. In the example, compensator converts the values by subtracting the constant (0.8) and then dividing by the second amplifier gain factor (0.2).

For example, if the ADC stores a digital value of 1.4 V for a sampling interval of the amplifier output, the actual incoming signal voltage value would 1.4 V minus the constant, 0.8 V, and divided by the second amplified gain factor, 0.2, to yield an actual incoming voltage of 3.0 V. Step 58 shows that the incoming voltage value is then used in the calculations of the rms value. Step 60 shows that the calculated rms voltages is presented, for example via a display to a user.

The peak values that can be measured are limited by the input range of the ADC 16. The present invention expands the peak values that can be used in determining the rms value by lowering the voltages input to the ADC. In the example above, assuming the ADC had a maximum input voltage of 2.0 V, actual peak values of up to 6.0 V could be measured, without exceeding the maximum input voltage of the ADC.

Figure 5:
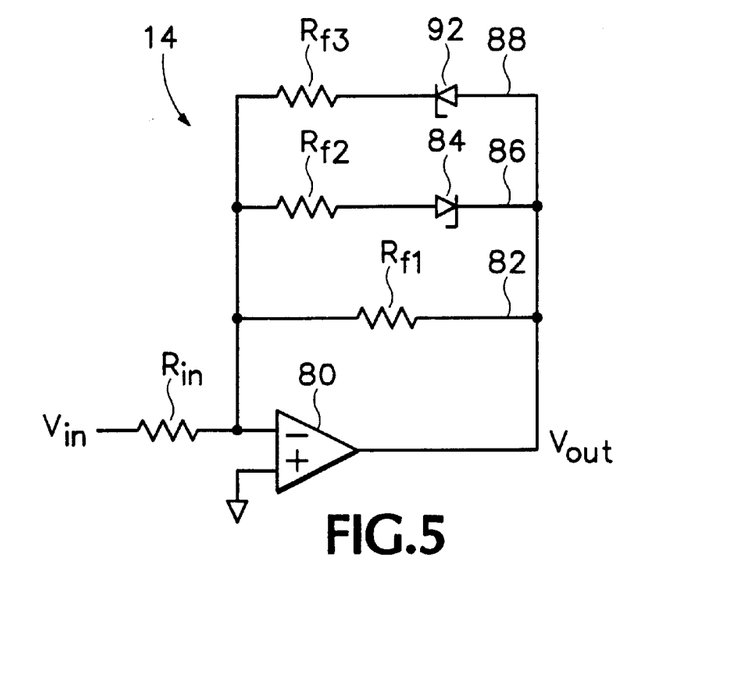
FIG. 5 is a circuit diagram that demonstrates the principles of the present invention.

FIG. 5 shows an idealized circuit that demonstrates the principles of the present invention. Skilled persons will recognized that the simplified circuit of FIG. 5 is not itself functional, but presents principles from which skilled persons will be able to create a functional circuit. Amplifier circuit 14 includes an input resistor $R_{in}$, an operational amplifier 80 having three feedback paths to the inverting input.

A first feedback path 82 includes a first feedback resistor $R_{f1}$. A second feedback path 86 includes a second resistor $R_{f2}$ and a breakdown diode 84. A third feedback path 88 includes a third feedback resistor $R_{f3}$ and a second breakdown diode 92. Breakdown diodes 84 and 92 conduct in opposite directions. As a small positive or negative voltage is applied to input resistor $R_{in}$, neither breakdown diode will conduct, so only feedback path 82 will allow current flow. The amplifier gain will, therefore, be $-R_{f1}/R_{in}$. When $V_{in}$ exceeds a predetermined threshold positive voltage, breakdown diode 84 will begin to conduct, and the amplifier gain will be $-1/R_{in} \times (R_{f1} \times R_{f2})/(R_{f1}+R_{f2})$ Similarly, when $V_{in}$ exceeds a predetermined negative voltage value, the voltage across breakdown diode 92 cause it to conduct and the amplifier gain will be $-1/R_{in} \times (R_{f1} \times R_{f3})/(R_{f1}+R_{f3})$. Points 96 and 98 on transfer function curve 34 show the points where breakdown diodes 84 and 92, respectively, begin to conduct.

Figure 6:
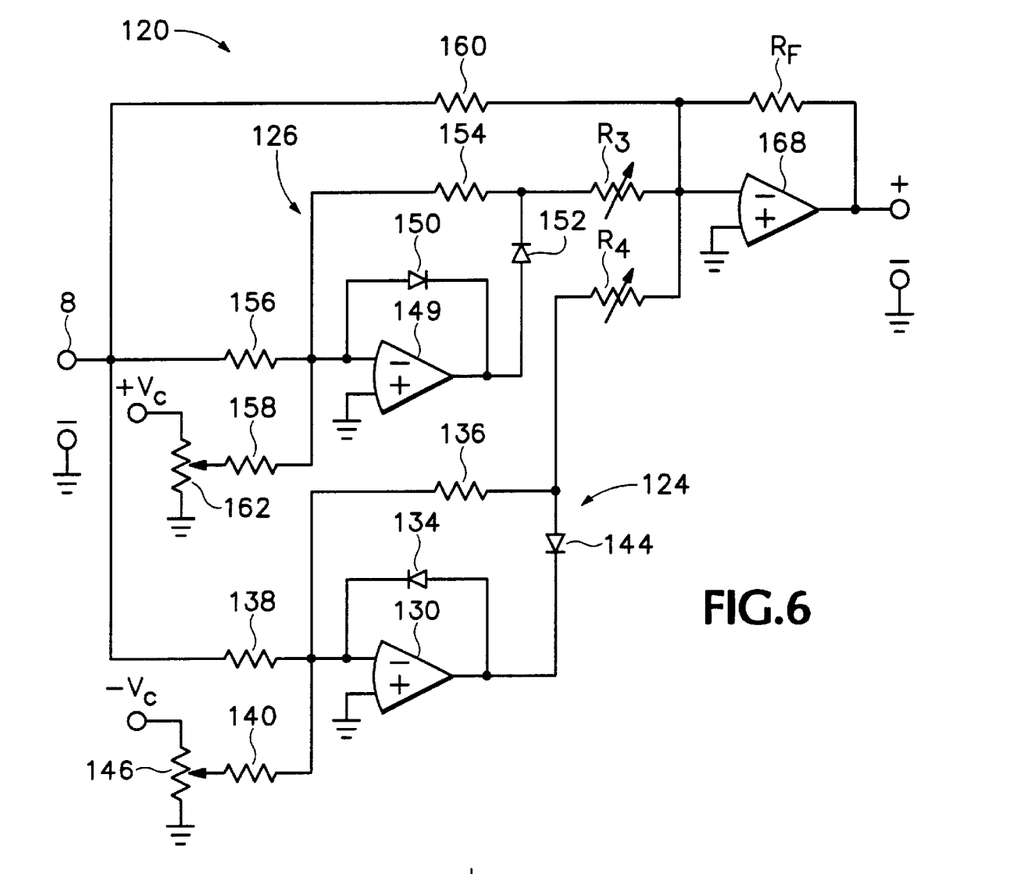
FIG. 6 is a functional but simplified circuit diagram of a circuit that could be used in the present invention.
Figure 7:
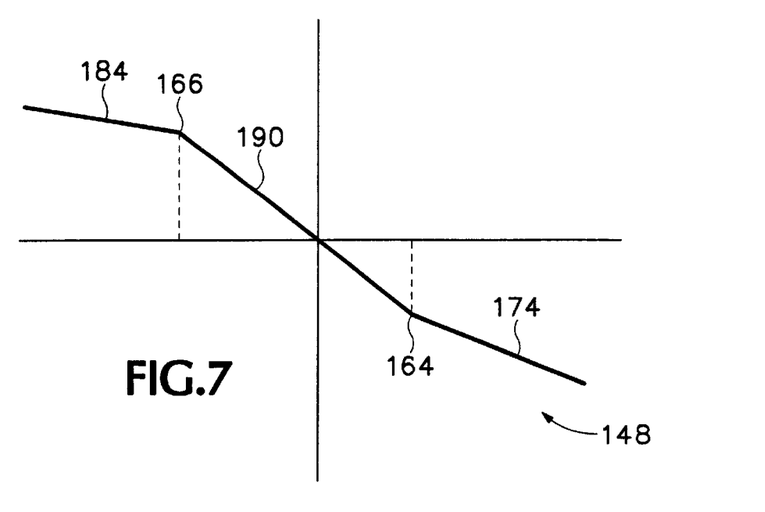
FIG. 7 shows an ideal transfer function of the circuit in FIG. 6.

FIG. 6 shows a functional, but simplified amplifier circuit 120 that further demonstrates the principles of the present invention. FIG. 7 shows the transfer function of the amplifier of FIG. 6. Skilled persons will recognized that the circuit of FIG. 6 will be modified by a circuit designer depending upon the requirements of a particular application.

Amplifier circuit 120 includes a circuit 124 that controls the negative breakpoint and a circuit 126 that controls the positive breakpoint. Circuit 124 includes an operational amplifier 130 having a diode 134 between its output and its inverting input. Resistors 136, 138, and 140 all have the same resistance value, R1, and one terminal of each is connected to the summing node of operational amplifier 130. The second terminal of resistor 136 is connected through a diode 144 to the output of operational amplifier 130. The second terminal of resistor 138 is connected to the incoming signal, and the second terminal of resistor 140 is connected through the center terminal of a variable resistor 146 connected between voltage source, $-V_c$ and ground. The voltage drop across the portion of resistor 146 between resistor 140 and $-V_c$ determines the negative breakpoint 146 on the transfer function 148.

Circuit 126 includes an operational amplifier 149 and is similar to circuit 124, but the voltage source is $+V_c$ and diodes 150 and 152 are reversed in direction from diodes 134 and 144. Resistors 154, 156, and 158 have a resistance value of $R_1$, the same value as resistors 136, 138, and 140. A variable resistor 162 determines the positive breakpoint 166 of transfer function 148. Alternatively, rather than adjusting variable resistor 162 to produce a predetermined breakpoint, a fixed resistor having a resistance within a prespecified range can be used. The actual breakpoint of the circuit with the fixed resistor is then measured and stored for later use in calculations involving the breakpoint.

The output of circuit 120 is taken from the output terminal of a third operational amplifier 168. Connected to the summing node of operational amplifier 168 is a feedback resistor $R_F$ that connects to the output of operational amplifier 168 and a resistor 160 that connects to the incoming signal voltage. Resistor 160 also has a resistance of $R_1$.

A variable resistor $R_4$ between circuit 124 and the summing node of operational amplifier 168 determines the slope of a segment 174 of transfer function 148 after the breakpoint 164. The slope of segment 174 is $(R_F/R_1)-(R_F/R_4)$. A variable resistor $R_3$ between circuit 126 and the summing node of operational amplifier 168 determines the slope of a second segment 184 of transfer function 148 before the breakpoint 166. The slope of segment 184 is $(R_F/R_1)-(R_F/R_3)$. The slope of a center segment 190 of transfer function curve 148 is $(R_F/R_1)$.

Amplifier circuit 120 provides precise breakpoints and slopes and is relatively insensitive to temperature changes. Resistors 146, 162, $R_3$, and $R_4$ are shown as variable resistors to emphasize that c,hanging the value of these resistors changes the slope of segments 174 and 184 and breakpoints 164 and 166. These variable resistors are preferably replaced with fixed resistors once desired properties of the circuit are specified and resistance values calculated. Alternatively, as described above with respect to variable resistor 162, rather than using resistors having the exact values required to produce predetermined breakpoints and slopes, fixed resistors having resistances within limited ranges of values can be used. The actual circuit properties are then measured to characterize the transfer function, and the measured slope and breakpoint values are stored for use in later calculations.

Rms calculator 20 is preferably implemented using a squaring circuit followed by an rms digital filter and a square root circuit. Each digital sample from the ADC is squared and then presented to a digital filter where it is filtered in a continuous fashion to produce rms values.

The transfer function of the rms digital filter is modeled after the thermodynamic principles of applying a signal to a temperature sensitive resistor in the manner of the thermal rms converter. In this way, the rms value may be obtained using a stream of digital samples from a signal without regard to the period of the signal while avoiding the difficulties of providing thermally isolated matched resistors or in having to choose an integration period to calculate the rms value.

According to the thermodynamic model, the resistor heats up according to the power in the signal applied across it such that the power dissipated in the resistor is proportional to the square of the signal voltage. The resistor heats to an equilibrium point where the energy added is equal to the energy lost. The rms value of the signal at this equilibrium point is the same as the amplitude of a d.c. signal that heats the resistor to the same temperature. As such, the resistor acts as filter for the energy applied to it and the signal period is not relevant to its operation. There is no requirement that the signal be periodic because this filtering action takes place continuously.

In modeling the thermodynamic behavior of the resistor, the rms digital filter may be implemented in its simplest form as an infinite impulse response (IIR) filter according to the following general equation $$Y_n = aX_n^2 + bY_{n-1}$$

in which the filter constants a and b are chosen so that $$a+b=1$$

The rms digital filter is then implemented according to following equation:

$$Y_n = a(x_n)^2 - aY_{n-1} + Y_{n-1}$$

where:
$Y_n$ is the present filtered digital sample
$Y_{n-1}$ is the past filtered digital sample
$X_n$ is the present digital sample In an equilibrium state, $Y_n=Y_{n-1}$ and added energy, represented by $a(x_n)^2$, equals energy lost, represented by $aY_{n-1}$, making $Y_n$ and $X_n$ steady values. Therefore, $X_n$ is equivalent to a steady d.c. value which is the square root of $Y_n$ and thus represents the rms value.

The rms digital filter within the rms converter extends this fundamental concept by having a transfer function that is essentially a low pass filter that extracts the rms value from the stream of digital samples in a continuous manner thus requiring no knowledge of the period of the signal. The squaring and rms digital filtering operations take place in real-time using each digital measurement value as it arrives. Next, a square root of the digital measurement values is taken, preferably only when a display update is made, to obtain the present rms value from the rms filter. In addition, the rms digital filter is optimized in terms of settling time, stop band frequency and attenuation, pass band ripple, and other filter parameters using optimization techniques known in the art. For a given accuracy and resolution, the rms digital filter can be optimized to provide faster responses than prior art rms converters.

A measurement bandwidth, which is typically determined as a design requirement for the measurement instrument, determines the minimum sample rate needed for the sampling system. Frequency components in the input signal beyond the measurement bandwidth would not be measured. The sampling system may comprise a sigma-delta converter followed by a decimation filter or alternatively a conventional ADC. The sampling system samples the input signal having an arbitrary waveshape to provide the digital samples at a sample rate to the rms converter. The rms values developed as described above from the rms converter are provided to a display on the measurement instrument, typically at an update rate determined by a microprocessor.

The input signal provided by the voltage source 8 may be an alternating current (a.c.) signal, a direct current (d.c.) signal or a combination of a.c. plus d.c. on the same waveform. The input signal may have a sinusoidal waveshape with a stable period or it may simply be random noise with no period or discernible waveshape. It is desirable that the measurement instrument 4 be capable of displaying the rms (root-mean-square) value of the input signal without any knowledge of its period or waveshape within a desired measurement bandwidth.

Figure 8:
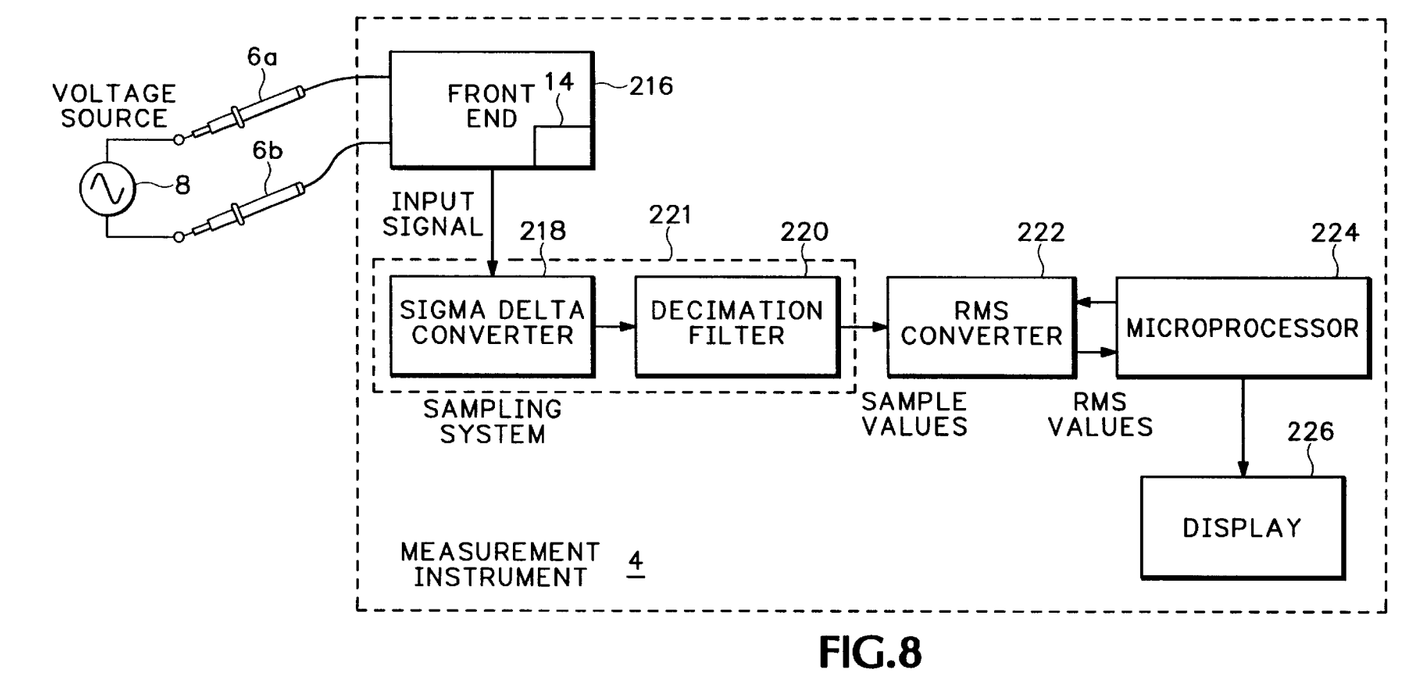
FIG. 8 is a block diagram of one embodiment of the measurement instrument in FIG. 1.

FIG. 8 is a simplified block diagram of the measurement instrument 4 (shown in FIG. 1) according to the preferred embodiment of the present invention. The voltage source 8 is coupled via the test leads 6a and 6b to a front end 216 within the measurement instrument 4. The front end 216 includes amplifier 14 having a non-uniform transfer function and may contain over-voltage and over-current protection circuits, other amplifiers, attenuators, and filters in order to provide a scaled input signal of suitable amplitude level and bandwidth for conversion into digital samples.

Sigma-delta converter 218 is an over-sampling type analog to digital converter (ADC) which generates raw sample data at a sample rate substantially higher than the Nyquist rate for a selected measurement bandwidth, as is known in the art. The raw sample data may be converted to digital samples at base band using a decimation filter 220 as is also known in the art. In the preferred embodiment, the measurement bandwidth was chosen to be 500 kilohertz, with the sigma-delta converter 218 operating at a sample rate of ten megasamples per second (10 MS/s) for a 20:1 ratio. The sigma-delta converter 218 generates the raw sample data with a resolution of 5 bits which is supplied to the decimation filter 220 which low-pass filters the raw sample data to provide digital samples at 2.5 MS/s with a resolution of 13 bits (along with an additional sign bit).

The decimation filter 220 may be implemented as a finite impulse response (FIR) filter, as a infinite impulse response (IIR) filter, or as a hybrid of FIR and IIR filters, with the filter constants and structure chosen to obtain a desired transfer function. The sigma-delta converter topology is desirable because no precision components are needed in the converter, thus allowing for the circuitry to be implemented easily as a monolithic integrated circuit as is known in the art. The sigma-delta converter 218 and decimation filter 220 collectively comprise a sampling system 221 which converts the input signal to a stream of digital samples according to a sample rate.

The digital samples are provided as a continuous data stream at a rate of 2.5 MS/s to an rms converter 222. The function of compensator 18, which rescales the digital samples to compensate for the non-linear output of amplifier 14 of front end 216, is performed in rms converter 222. The rms converter 222 processes each of the digital samples in the continuous data stream as they arrive with no knowledge of the periodicity or waveshape of the input signal, as explained in more detail below. A microprocessor 224 receives rms values produced by the rms converter and selectively provides the rms values to a display 226 where they may be displayed in numerical or graphical format as desired. The rms values may be provided continuously or in response to an update signal from the microprocessor 224.

The rms converter 222 offers a number of advantages over the prior art particularly when applied in the measurement instrument 4 as a handheld, battery-operated package. The sigma-delta converter 218, the decimation filter 220 and the rms converter 222 may all be implemented as monolithic integrated circuits, with a minimum of external precision components, thus reducing cost, board space, power consumption, and manufacturing complexity.

The rms converter 222 further offers substantial performance advantages over the prior art. The crest factor, a substantial limitation in monolithic rms converters, is limited in the present invention only by the sampling system 221 and word length of the rms digital filter 232. At the same time, the a.c. bandwidth of the rms converter 222 is constant, being defined according the filter constants applied in the rms digital filter 232. Furthermore, the performance of the rms converter 222, defined in terms of transfer function and a.c. bandwidth, are substantially constant over a wide range of amplitudes of the input signal. The rms digital filter 232 may have as many poles and zeros as needed to achieve adequate stopband rejection of a.c. ripple components while maintaining a desired settling time and no overshoot in its pulse response characteristic.

Figure 9:
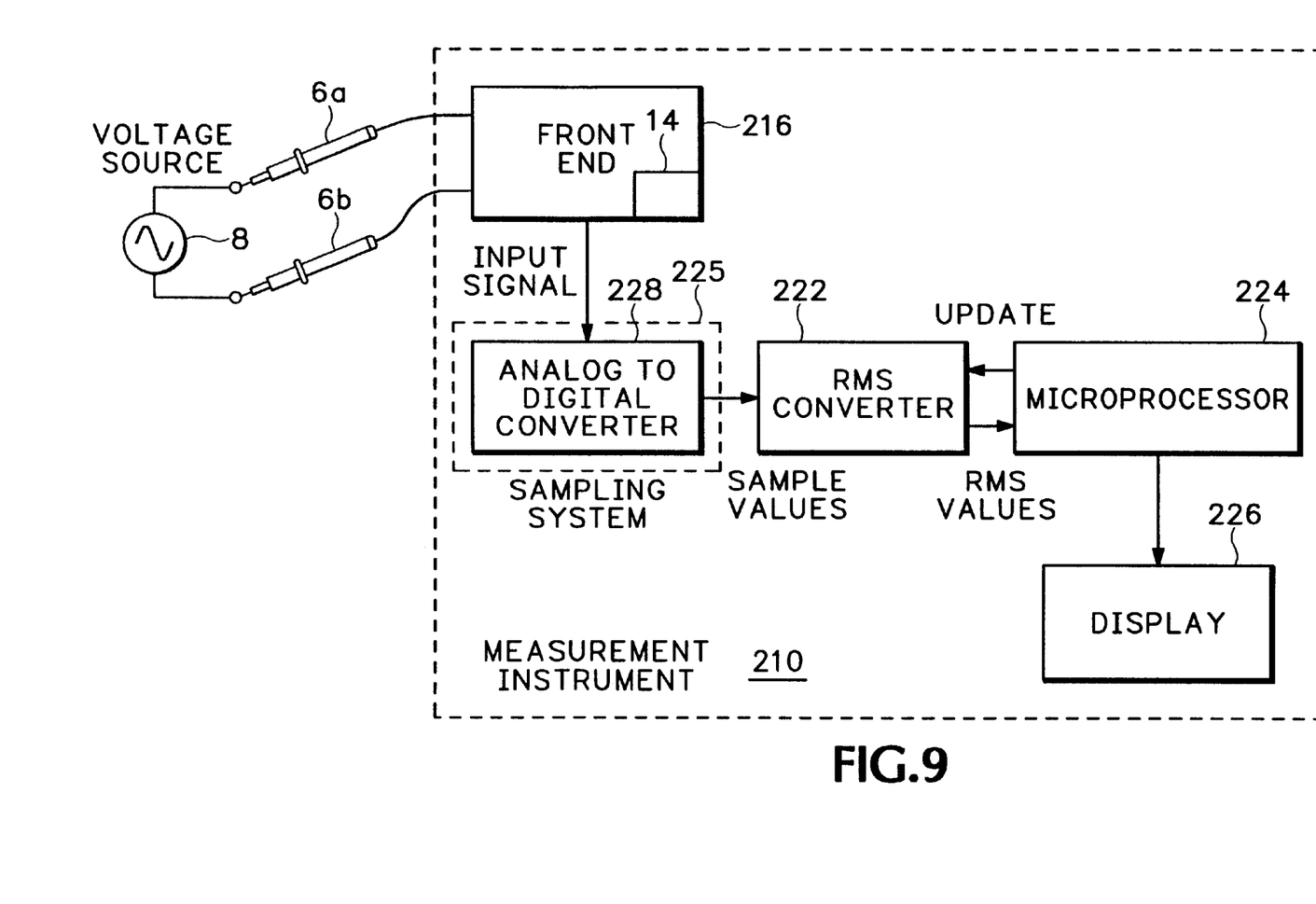
FIG. 9 is a block diagram of an alternative embodiment of the measurement instrument in FIG. 1.

FIG. 9 is a simplified block diagram of the measurement instrument according to an alternative embodiment of the present invention in which a sampling system 225 consists of an analog-to-digital converter (ADC) 228. The voltage source 8 is coupled via the test leads 6a and 6b to a front end 216 within the measurement instrument 210. The front end 216 includes amplifier 14 having a non-uniform transfer function and may contain over-voltage and over-current protection circuits, amplifiers, attenuators, and filters in order to provide the input signal of suitable amplitude level and bandwidth to the sampling system 225.

The ADC 228 generates digital samples at a sample rate higher than the Nyquist rate which is twice the measurement bandwidth, as is known in the art. Because the measurement bandwidth was chosen to be 500 kilohertz, the ADC 228 must operate at a sample rate exceeding 1 MS/s and preferably at 10 MS/s, with the actual sample rate driven by considerations of conversion accuracy. Other ADC technologies may be readily substituted for the ADC 228, with consideration given to component cost, maximum sample rate, power consumption, as well as converter accuracy and resolution, to provide digital samples representative of the input signal to the rms converter 222.

The digital samples are provided as a continuous data stream from the ADC 228 to the rms converter 222. The rms converter 222 processes each of the digital samples in the continuous data stream as they arrive with no knowledge of the periodicity or waveshape of the input signal, as explained in more detail below. The rms converter 222 compensates for the non-uniform transfer function of amplifier 14. A microprocessor 224 receives the rms values produced by the rms converter and selectively provides the rms values to a display 226 where they may be displayed in numerical or graphical format as desired. The rms values may be provided continuously or in response to an update signal from the microprocessor 224.

Figure 10:
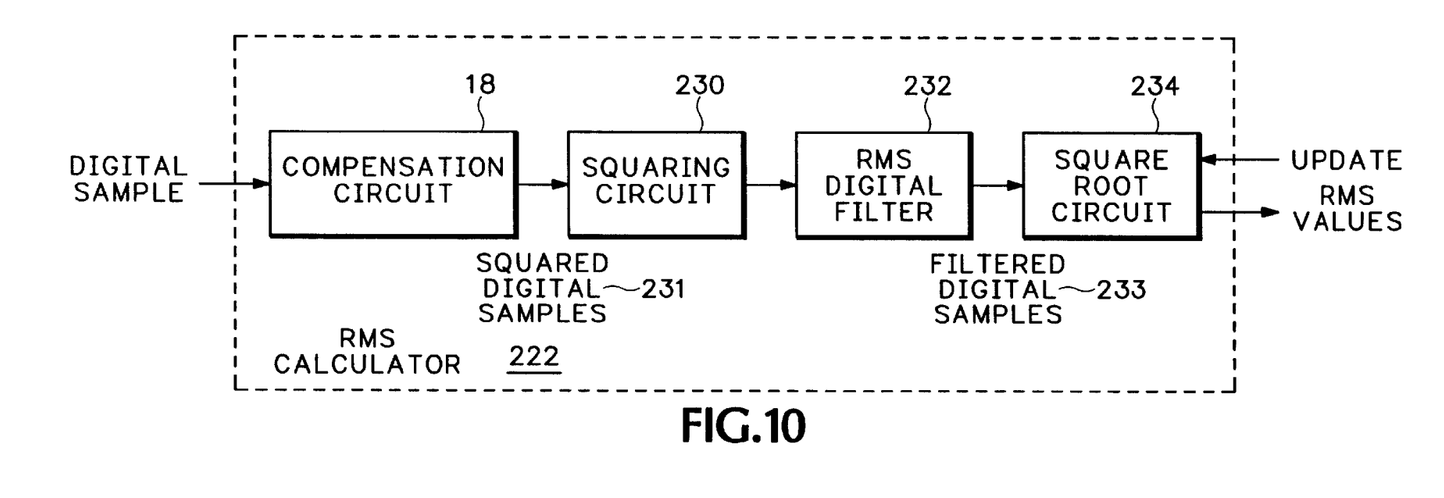
FIG. 10 is a simplified block diagram of the rms converter used with the present invention.

FIG. 10 is a simplified block diagram of the rms converter 222 according to the present invention. Digital samples from the sigma-delta converter 218 and decimation filter 220 as shown in FIG. 8 or the ADC 228 as shown in FIG. 9 arrive at the rms converter 222. The digital samples are rescaled as necessary in compensation circuit 18 to compensate for the non-uniform transfer function of amplifier 14. Each digital sample is then squared in the squaring circuit 230 to produce squared digital samples 231. Alternatively, the samples could be squared before resealing. Each squared digital sample is provided to an rms digital filter 232 which has filter coefficients chosen to allow the rms digital filter 232 to operate as a low pass filter. The filter coefficients and digital filter topology may be designed according to known IIR and FIR techniques, or a combination of FIR and IIR techniques, to provide a low pass filter having desired characteristics. In the preferred embodiment, the rms digital filter 232 has the following characteristics:

| | |
|---|---|
| measurement bandwidth | 500 kilohertz maximum |
| stopband of −123 decibels | 49.9 hertz maximum |
| settling time to 0.001% of final value | 0.5 seconds maximum |
| step response overshoot | 0.0% maximum |
| acquisition rates | 0.125, 0.5, 2, and 1000 hertz |

In the digital rms filter 232, it was important that there be no overshoot in the step response along with a high stopband rejection of 50/60 hertz ripple from power line frequencies. Filtered rms values produced by the digital rms filter 232 are provided as filtered digital samples 233 to a square root circuit 234 which produces the rms value by taking the square root of the present filtered rms value, either continuously or as needed in response to the update signal received from the microprocessor 224.

The squaring circuit 230, the rms digital filter 232, and the square root circuit 234 may be implemented in hardware, in software, or a combination thereof according to the requirements of the application. The transfer function of the rms digital filter 232 is readily adaptable to a different sample rates and accuracy requirements. The sampling system 221 may comprise any of a variety of converter technologies suitable for generating digital samples of the input signal at a desired sample rate and accuracy.

While a preferred embodiment of the present invention has been shown and described, it will be apparent to those skilled in the art that many changes and modifications may be made without departing from the invention in its broader aspects. For example, a transfer function having more than two sections of differing slopes can be used. The transfer function does not need to be linear or affine, and could be, for example, logarithmic. Moreover, the functions of the invention need not be accomplished in separate. circuits. For example, the compensator could be combined with the rms converter. The appended claims are therefore intended to cover all such changes and modifications as fall within the true spirit and scope of the invention.

What is claimed is:

1. A method of determining an rms voltage corresponding to a time-varying electrical signal, comprising:

amplifying by using an amplifier the time-varying signal to produce an amplified signal, the amplifier characterized by a transfer function having a non-uniform slope, the slope being smaller for larger values of an incoming signal;

applying the amplified signal to an analog to digital converter; and calculating an rms value representative of the incoming signal, the rms calculation including compensating for the non-uniform slope of the transfer function, thereby allowing increased accuracy in a higher slope region of the transfer function in which most voltage values of the time-varying signals lie and increased range in a lower sloped region in which fewer voltage values of the time-varying signal lie, to permit accurate determination of rms values at high crest factors.

2. The method of claim 1 in which applying the amplified signal to an analog to digital converter includes producing digital samples from the amplified signal and in which calculating an rms value representative of the incoming signal includes:

squaring each of said digital samples in a squaring circuit to produce squared digital samples;

filtering each of said squared digital samples in an rms digital filter in a continuous manner wherein said rms digital filter operates as a low pass filter to produce filtered digital samples; and taking a square root of said filtered digital samples to produce said rms values of said input signal.

3. A method of determining an rms voltage corresponding to a time-varying electrical signal, comprising:

amplifying by using an amplifier the time-varying signal to produce an amplified signal, the amplifier characterized by a transfer function having a non-uniform slope, the slope being smaller for larger values of an incoming signal;

applying the amplified signal to an analog to digital converter; and calculating an rms value representative of the incoming signal, the rms calculation including compensating for the non-uniform slope of the transfer function, thereby allowing increased accuracy in a higher slope region of the transfer function in which most voltage values of the time-varying signals lie and increased range in a lower sloped region in which fewer voltage values of the time-varying signal lie, to permit accurate determination of rms values at high crest factors, in which compensating for the non-uniform slope is performed digitally.

4. A method of determining an rms voltage corresponding to a time-varying electrical signal, comprising:

amplifying by using an amplifier the time-varying signal to produce an amplified signal, the amplifier characterized by a transfer function having a non-uniform slope, the slope being smaller for larger values of an incoming signal;

applying the amplified signal to an analog to digital converter; and calculating an rms value representative of the incoming signal, the rms calculation including compensating for the non-uniform slope of the transfer function, thereby allowing increased accuracy in a higher slope region of the transfer function in which most voltage values of the time-varying signals lie and increased range in a lower sloped region in which fewer voltage values of the time-varying signal lie, to permit accurate determination of rms values at high crest factors, in which amplifying the time-varying signal includes amplifying the signal in accordance with a transfer function having a first slope below a predetermined incoming voltage value and a second smaller slope above the predetermined voltage value, thereby amplifying a first portion of the time-varying signal that is below the predetermined value at a first gain factor and amplifying a second portion of the time-varying signal that is above the predetermined value at a second, smaller gain factor, the amplified first and second portions together forming an amplified signal.

5. The method of claim 4 in which:

the amplified signal includes a first portion corresponding to the portion of the incoming signal that was amplified at the first gain and a second portion corresponding to the portion of the incoming signal that was amplified at the second gain; and calculating an rms value includes integrating the amplified signal using a weighting factor, the weighting factor for the first and second portions of the amplified signal being determined by the amplifier gain for each portion.

6. A method of measuring an rms value of a time-varying electrical signal, comprising:

amplifying the electrical signal using an amplifier having a transfer function having an non-uniform slope, the slope of the transfer function being smaller for larger incoming signals, the amplifier producing from the time-varying electrical signal an amplified signal; and determining from the amplified signal an rms value representative of the time-varying electrical signal, the determination including appropriately weighting in accordance with the transfer function the amplified signal to produce an accurate rms signal, in which the electrical signal includes portions below a predetermined value and portions above the predetermined value and in which amplifying the electrical signal includes amplifying at a first gain the portions below the predetermined value and amplifying at a second gain the portions of the electrical signal above the predetermined value, the amplified portions of both portions together comprising an amplified signal.

7. An apparatus for determining an rms value of a time-varying electrical signal, comprising:

an amplifier characterized by a transfer function having a non-uniform slope, wherein the transfer function has a first slope for incoming signal values within a value range and at least a second slope for incoming signal values outside the value range;

an analog to digital converter in electrical communication with the output of the amplifier; and a digital rms calculator in electrical communication with the output of the analog-to-digital converter, the digital rms calculator determining the root mean square value of the time-varying signal by weighting the signals to compensate for the non-uniform slope of the transfer function, in which the digital rms calculator includes using a weighting factor corresponding to the amplifier gain.

8. A method of measuring an rms value of a time-varying electrical signal, comprising:

amplifying the electrical signal using an amplifier having a transfer function having an non-uniform slope, the slope of the transfer function being smaller for larger incoming signals, the amplifier producing from the time-varying electrical signal an amplified signal; and determining from the amplified signal an rms value representative of the time-varying electrical signal, the determination including appropriately weighting in accordance with the transfer function the amplified signal to produce an accurate rms signal.

9. The method of claim 8 in which the step of determining from the amplified signal an rms value includes producing digital samples from the amplified signal using a sampling system.

10. The method of claim 9 in which the step of determining from the amplified signal an rms value further includes:

squaring each of said digital samples in a squaring circuit to produce squared digital samples;

filtering each of said squared digital samples in an rms digital filter in a continuous manner wherein said rms digital filter operates as a low pass filter to produce filtered digital samples; and taking a square root of said filtered digital samples to produce said rms values of said input signal.

11. An apparatus for determining an rms value of a time-varying electrical signal, comprising:

an amplifier characterized by a transfer function having a non-uniform slope, wherein the transfer function has a first slope for incoming signal values within a value range and at least a second slope for incoming signal values outside the value range;

an analog to digital converter in electrical communication with the output of the amplifier; and a digital rms calculator in electrical communication with the output of the analog-to-digital converter, the digital rms calculator determining the root mean square value of the time-varying signal by weighting the signals to compensate for the non-uniform slope of the transfer function.

12. The apparatus of claim 11 in which the digital rms calculator includes:

a squaring circuit for receiving digital samples of an input signal of unknown period to produce squared digital samples;

an rms digital filter coupled to said squaring circuit to continuously receive said squared digital samples and produce filtered digital samples wherein said rms digital filter operates as a low pass filter; and a square root circuit for calculating the square root of said filtered digital samples to produce an rms value of said input signal.

13. A measurement instrument for measuring the rms value of an input signal of unknown period, comprising:

an amplifier for amplifying the input signal and having a transfer function with a non-uniform slope, the transfer function having a smaller slope for higher voltages and a larger slope for smaller voltages, the amplifier amplifying to a greater degree the lower voltage signals falling on the larger slope portion of the transfer function and amplifying to a lesser degree the higher voltage signals falling on the smaller slope portion of the transfer function;

a sampling system coupled to said amplifier to produce digital samples of said input signal as amplified by said amplifier;

an rms converter coupled to said sampling system to continuously receive said digital samples, adjust the signal for the non-uniform slope of the transfer function, and calculate an rms value of said input signal;

a microprocessor for receiving said rms value from said rms converter and determining an update rate; and a display coupled to said microprocessor for receiving and displaying said rms value at said update rate.

14. A measurement instrument for measuring the rms value of an input signal of unknown period according to claim 13, said sampling system further comprising an analog to digital converter.

15. A measurement instrument for measuring the rms value of an input signal of unknown period according to claim 13 further comprising a front end circuit interposed between said input signal and said sampling system to scale said input signal for said sampling system.

16. A measurement instrument for measuring the rms value of an input signal of unknown period according to claim 13, said sampling system further comprising:

a sigma-delta converter coupled to said input signal to produce raw digital samples; and a decimation filter coupled to said sigma-delta converter to receive said raw digital samples and produce said digital samples.

17. A measurement instrument for measuring the rms value of an input signal of unknown period according to claim 13, said rms converter further comprising:

a squaring circuit for receiving digital samples of said amplifier to produce squared digital samples;

an rms digital filter coupled to said squaring circuit to receive said squared digital samples and produce filtered digital samples wherein said rms digital filter operates as a low pass filter; and a square root circuit for calculating the square root of said filtered digital samples to produce said rms value of said input signal.

18. A measurement instrument for measuring the rms value of an input signal of unknown period according to claim 17, said rms digital filter further comprising an IIR filter.

19. A measurement instrument for measuring the rms value of an input signal of unknown period according to claim 15, said rms digital filter further comprising an FIR filter.

20. An apparatus for determining an rms value of a time-varying electrical signal, comprising:

an amplifier characterized by a transfer function having a non-uniform slope, wherein the transfer function has a first slope for incoming signal values within a value range and at least a second slope for incoming signal values outside the value range;

an analog to digital converter in electrical communication with the output of the amplifier; and a digital rms calculator in electrical communication with the output of the analog-to-digital converter, the digital rms calculator determining the root mean square value of the time-varying signal by weighting the signals to compensate for the non-uniform slope of the transfer function, in which the transfer function has a first slope for incoming signal values at or below a predetermined value and a second slope for incoming signal values at or above the predetermined value.

* * * * *